(12) United States Patent
Beecher

(10) Patent No.: US 8,346,498 B2
(45) Date of Patent: *Jan. 1, 2013

(54) PROGRAMMABLE DEVICE TESTING

(75) Inventor: David Beecher, Redmond, WA (US)

(73) Assignee: Leannoux Properties AG L.L.C., Wilmington, DE (US)

( * ) Notice: Subject to any disclaimer, the term of this patent is extended or adjusted under 35 U.S.C. 154(b) by 269 days.

This patent is subject to a terminal disclaimer.

(21) Appl. No.: 12/574,154

(22) Filed: Oct. 6, 2009

(65) Prior Publication Data

US 2010/0023819 A1    Jan. 28, 2010

Related U.S. Application Data

(63) Continuation of application No. 11/718,715, filed on Nov. 7, 2005, now Pat. No. 7,702,480.

(60) Provisional application No. 60/625,286, filed on Nov. 5, 2004.

(51) Int. Cl.
*G01R 31/00* (2006.01)
*G01R 31/14* (2006.01)

(52) U.S. Cl. ......... 702/119; 702/120; 702/121; 702/122

(58) Field of Classification Search .......... 702/119–124, 702/179–189; 714/742
See application file for complete search history.

(56) References Cited

U.S. PATENT DOCUMENTS

| 7,702,480 | B2 | 4/2010 | Beecher |
| 2002/0170000 | A1 | 11/2002 | Gorodetsky et al. |
| 2005/0273685 | A1 | 12/2005 | Sachdev et al. |
| 2005/0275981 | A1 | 12/2005 | Power |
| 2008/0103619 | A1 | 5/2008 | Beecher |

OTHER PUBLICATIONS

"Notice of Allowance", U.S. Appl. No. 11/718,715, (Jul. 9, 2009), 15 pages.
"Foreign Office Action", German Application No. 11 2005 002 723.6, (Sep. 21, 2009), 3 pages.
International Preliminary Report in Application No. PCT/US05/40369 dated Nov. 9, 2006, 8 pages.
International Search Report and Written Opinion in Application No. PCT/US05/40369 dated May 18, 2006, 6 pages.

*Primary Examiner* — Phuong Huynh

(57) ABSTRACT

According to some embodiments, characterization data can be loaded onto a programmable device. The characterization data can be configured to cause the programmable device to perform one or more functions if executed on the programmable device. It can then be determined whether or not loading the characterization data onto the programmable device caused the programmable device to be successfully programmed. An indication can be transmitted for receipt by an external device, the indication indicating whether or not the programmable device was successfully programmed.

20 Claims, 2 Drawing Sheets

PROGRAMMABLE DEVICE TESTING

RELATED APPLICATIONS

This application is a continuation of and claims priority to U.S. application Ser. No. 11/718,715, entitled "Manufacturing Test and Programming System," filed on Nov. 7, 2005, which in turn claims priority to U.S. Provisional Pat. App. No. 60/625,286, filed Nov. 5, 2004, the disclosures of which are incorporated in their entirety by reference herein.

BACKGROUND

Programmable integrated circuits have applications in all manner of devices. Many of the commodity electronic devices that we take for granted, such as cellular telephones, PDA's, music players and radios, have at least one programmable component among the circuitry on their printed circuit board (PCB). In the manufacturing of millions of these electronic devices yearly, each of the programmable integrated circuits are typically programmed and tested with the rest of the components on the board. With high volume manufacturing flow, it is desirable that the interaction with a single programmable integrated circuit be straight forward and fast. It is also desirable that the device be programmed and verified in as short a time as possible, with minimal interaction involving the in-circuit tester (ICT).

Early generations of PCB in-circuit testers used a functional testing methodology where test signals were applied at various circuit inputs and output signals were monitored by the ICT. Such functional testing suffers from at least two limitations. First, it can be difficult to formulate thorough and effective test programs suitable for gathering information concerning a variety of circuits designated for test because of the unique nature of individual circuits. Second, fault isolation to a particular element on a PCB or other circuit assembly having many circuit elements may require an accurate operational understanding of the assembled circuit.

It is often difficult to analyze sequential devices, e.g., devices that require a series of signal changes at the input before any change is detected on the output. The complicated nature of the relationships between test signals applied at circuit inputs and the resulting signals at the outputs of the individual sequential device makes it extremely difficult to determine the signals that may need to be applied at the circuit assembly inputs to "initiate" each sequential device in the circuit assembly. As a result of the limitations of functional testing, many circuit assembly testers utilize a technique known as in-circuit testing in which individual circuit components (both sequential and non-sequential) are tested via in-circuit application of test signals at the inputs of each component and concurrent observation of resulting output signals at the various outputs of each component.

For simple circuits, testing is often accomplished by applying appropriate voltages to circuit nodes to test for short or open circuits. Circuit nodes are any equipotential circuit element, such as, but not limited to, connecting wires, printed circuit board traces, edge connectors, and connector pins. Functional testing methods as described above may also be performed where the tester and/or test equipment has sufficient knowledge of circuit operation. As circuit assemblies become more complex, circuit testers have to adapt in order to accurately and thoroughly test these complex assemblies. With the added complexity and density due to miniaturization, it has become more important, and more difficult, to thoroughly test circuit assemblies.

Generally, typical automated circuit assembly tests include a host computer running a test program (i.e., a software application) that operates a test interface that communicates various steady-state voltages and test signals between test equipment and the device under test (DUT). The test interfaces may access the various test ports as well as other circuit nodes on the DUT. The test equipment may include numerous resources, such as voltage drivers, receivers, relays, and test pins arranged to engage appropriate locations of the DUT. The drivers and receivers are alternately connected and may be jointly connected in some embodiments (as for bidirectional data busses) in a systematic and clocked sequence to various nodes of the DUT. The drivers and receivers may be connected via relays and test pins that contact various circuit assembly nodes, giving the test equipment control of the embedded circuitry.

When the embedded circuitry includes programmable devices, the test program can become very complicated and spend an inordinate amount of time managing the programming and test process for a single device. If the in-circuit tester is engaged in programming a single embedded integrated circuit, all of the other nodes of the DUT may be held at a neutral state. Once the programmable device has been programmed, the entire DUT may be put into a state that will allow positive testing of the programmable device as well as its surrounding circuits. As a result the in-circuit tester programs can be significantly longer and require more resources within the in-circuit tester to execute properly. The overwhelming nature of this problem has typically caused manufacturers to program all programmable devices on another station prior to the assembly of the PCB or assemble sockets for later insertion of a programmed device. This option can cause double handling of all PCB's and an extra set of programming stations in the manufacturing flow.

DETAILED DESCRIPTION

Figure 1:
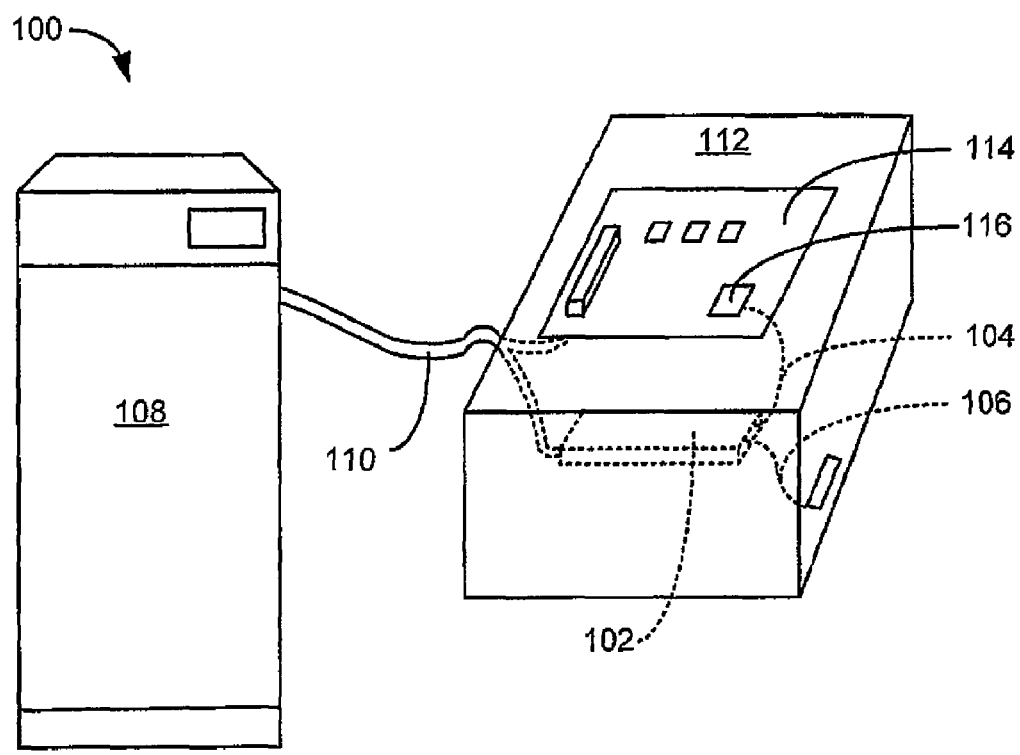
FIG. 1 illustrates a plan view of a manufacturing test and programming system in accordance with one or more embodiments.

One or more embodiments include a manufacturing test and programming system including a PCB tester and an in-system programmer electrically attached to the PCB tester. In some embodiments, a device under test having a programmable device attached thereon can be mounted on a tester station and the programmable device can be programmed with the in-system programmer.

In the following description, numerous specific details are given to provide a thorough understanding of certain embodiments. However, it will be apparent that one or more embodiments may be practiced without these specific details. In order to avoid obscuring the discussed embodiments, some well-known circuits, system configurations, and process steps are not disclosed in detail.

Likewise, the drawings showing embodiments of the device may be semi-diagrammatic and not to scale and some of the dimensions are for the clarity of presentation and are shown exaggerated in the drawings. Also where multiple embodiments are disclosed and described, having some features in common, for clarity and ease of illustration, description, and comprehension thereof, similar and like features one to another will ordinarily be described with like reference numerals.

The term "horizontal" as used herein can be defined as a plane parallel to the conventional plane or surface of the device under test (DUT) board, regardless of its orientation. The term "vertical" can refer to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

FIG. 1 illustrates a plan view of a manufacturing test and programming system 100 in accordance with one or more embodiments. The manufacturing test and programming system 100 includes an in-system programmer 102 (ISP) having an ISP cable 104 and a network interface cable 106. The manufacturing test and programming system 100 also includes a PCB tester 108, a tester cable 110, a tester station 112, and a device under test 114, such as a PCB, having a programmable device 116.

The PCB tester 108 can send test data and control information through the tester cable 110 to the device under test 114 mounted on the tester station 112. The tester station 112 is one example of a receiving platform for the device under test 114. A series of positioned probes on the tester station 112 can electrically contact the nodes of the device under test 114 for test analysis. The programmable device 116, such as a field programmable gate array (FPGA), mounted on the device under test 114, can be programmed with characterization data in order to implement a design function for the device under test 114. The PCB tester 108 can manage the initiation of the programming operation. In some embodiments, the PCB tester 108 may have no direct interaction with the programmable device 116. The programming operation and verification of the programmable device 116 can be executed by the in-system programmer 102 without the assistance or control of a host computer.

The in-system programmer 102 can be configured to program an instance of the programmable device 116 in the device under test 114. The programming operation can be performed by loading characterization data into the programmable device 116. The characterization data can cause the programmable device 116 to execute the designed function. If there are multiple instances of the programmable device 116 or different devices that are to be programmed, an array of the in-system programmer 102 can be configured within the tester station 112. Each instance of the in-system programmer 102 can be configured to autonomously program an instance of the programmable device 116 with specific characterization data for the logic function implemented in that instance of the programmable device 116.

The in-system programmer 102 can be configured via the network interface cable 106. Specific configuration information for the target version of the programmable device 116 can be downloaded to the in-system programmer 102. In the processing of the device under test 114, the PCB tester 108 can initiate the in-system programmer 102 and then exercise other areas of the device under test 114. In accordance with some embodiments, the PCB tester 108 can then return the focus to the in-system programmer 102 for an indication that the process was completed and the programmable device 116 was successfully programmed. The in-system programmer 102 can indicate pass or fail to the PCB tester 108 through the tester cable 110. If the programmable device 116 was successfully programmed, the PCB tester 108 can verify the programmable device 116. If the programmable device 116 was not successfully programmed, the in-system programmer 102 can indicate fail to the PCB tester 108 indicating the board may be removed and the next board becomes the device under test 114. In some embodiments, the programming and test of the programmable device 116 can occur in the test phase of the PCB manufacturing, reducing the amount of time that the device under test 114 remains on the tester station 112.

Figure 2:
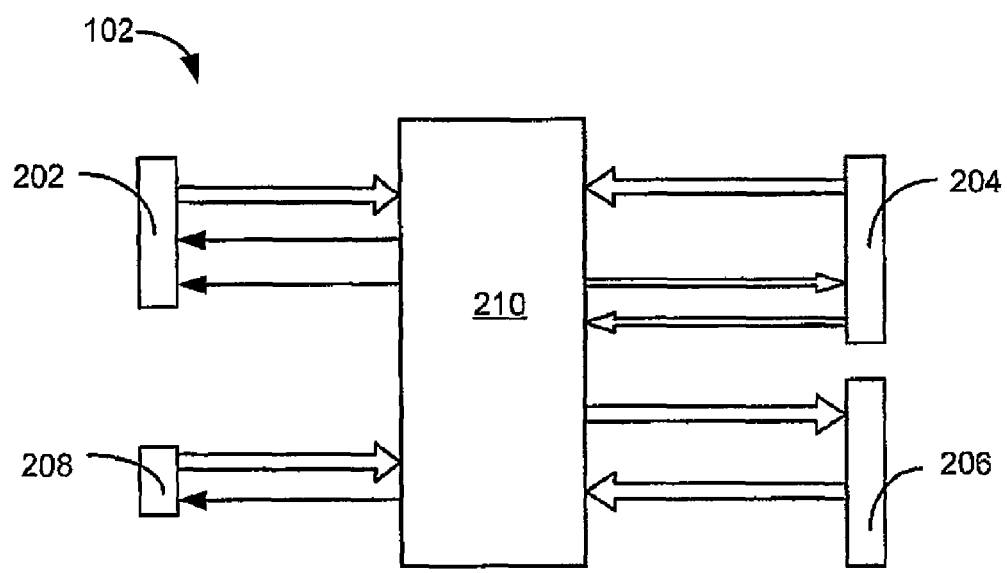
FIG. 2 is a block diagram of an in-system programmer in accordance with one or more embodiments.

FIG. 2 illustrates a block diagram of the in-system programmer 102 illustrated in FIG. 1. For purposes of this discussion, FIG. 2 is discussed with reference to certain elements discussed in FIG. 1. The block diagram depicts the communication paths into and out of the in-system programmer 102 in accordance with one or more embodiments. The communication paths include a PCB tester interface 202, an ISP interface 204, a network interface 206, a serial protocol interface 208, and a core logic 210. The PCB tester interface 202 contains a START signal that can enable the PCB tester 108 to initiate the programming operation and await a pass or fail response. In some embodiments, the PCB tester interface 202 attaches to the tester cable 110. The ISP interface 204 can be configured to be attached to the ISP cable 104. In some embodiments, the ISP interface 204 can be a primary interface for programmable devices that support an advanced interface, such as a USB interface.

In an example implementation, the network interface 206 can attach to the network interface cable 106. The network interface 206 can be used to set-up programming information and timing parameters within the in-system programmer 102. According to some embodiments, different communication protocols may be utilized to communicate with the programmable device 116, such as universal serial bus (USB), serial peripheral interface (SPI), or joint test action group (JTAG), and timing parameters may be different. The network interface 206 can enable a test system controller (not shown) to configure the in-system programmer 102 appropriately to handle the programming task. The specific configuration for the programmable device 116 can be downloaded through the network interface 206 and stored in the core logic 210.

According to some embodiments, the network interface 206 can also support an ID feature for operating an array of the in-system programmer 102. One of the lines of the network interface 206 can be pulse width modulated by a first instance of the in-system programmer 102 and sent to a subsequent instance of the in-system programmer 102. The in-system programmer 102 can receive the signal, measure the pulse width, translate the width to an array address, increase the pulse width by a fixed amount, and send the pulse width modulated signal to a next instance of the in-system programmer 102 in the array. In some embodiments, this process can be repeated until all instances in the array have network addresses.

According to some embodiments, some of the programmable devices 116 may not be large enough to support an advanced interface, such as the USB interface, so the in-system programmer 102 can be configured with the serial protocol interface 208 as well. The serial protocol interface 208 can support one or more commonly used serial interfaces, such as SPI and JTAG. These serial protocols can be used to program smaller devices.

Figure 3:
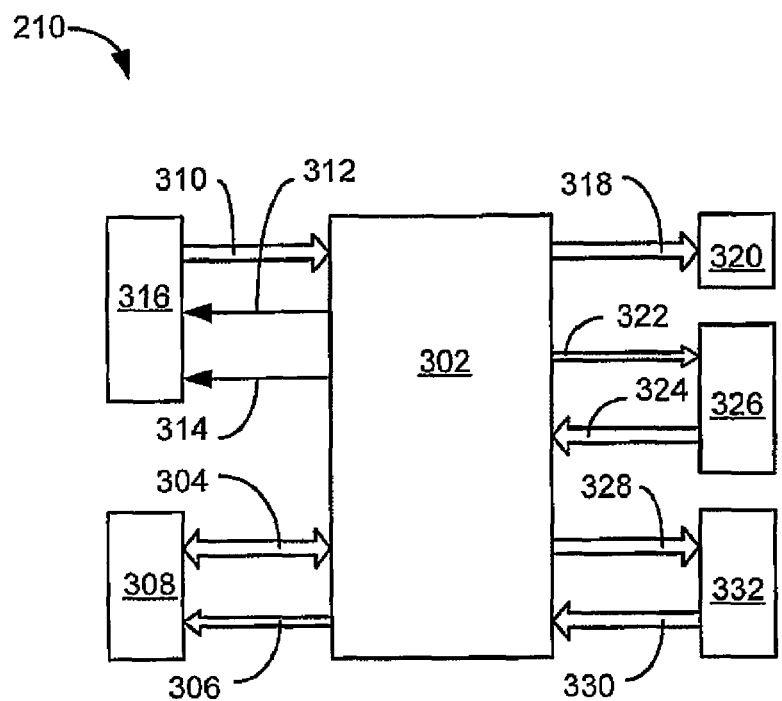
FIG. 3 is a block diagram of a core logic in accordance with one or more embodiments.

FIG. 3 illustrates a block diagram of the core logic 210 as shown in FIG. 2 and in accordance with one or more embodiments. For purposes of this discussion, FIG. 3 is discussed with reference to certain features illustrated in FIGS. 1 and 2.

The block diagram illustrated in FIG. 3 includes a control device 302, such as a microprocessor, having a memory address/data bus 304 and memory control lines 306, a memory device 308, an ICT input bus 310, a PASS line 312, a FAIL line 314, optical isolators 316, an LED bus 318, light emitting diodes 320, an ISP programming bus 322, an ISP status bus 324, an ISP connector 326, a network TX bus 328, a network RX bus 330, and line drivers 332.

According to some embodiments, in a set-up phase the core logic 210 receives communication parameters and data through the line drivers 332 and the network RX bus 330. The control device 302 can use the communication parameters to establish the appropriate programming path and timing for the programmable device 116 that has been targeted. In some embodiments, the control device 302 can store the data used to configure the programmable device 116 in the memory device 308, such as a non-volatile memory, by manipulating the memory address/data bus 304 and activating the memory control lines 306. The control device 302 can send status across the network TX bus 328 through the line drivers 332. In some embodiments, the core logic 210 is now ready to actively program the programmable device 116. According to some embodiments, the power to the in-system programmer 102 can be removed without losing the configuration data stored in the memory device 308 for the programmable device 116.

In a programming phase, the PCB tester 108 can activate the PCB tester interface 202. The optical isolators 316 can replicate the information on the PCB tester interface 202 on the ICT input bus 310. The ICT input bus 310 can contain addressing information configured to be used to select one of an array of the in-system programmers 102, a RESET line, and a START line. In some embodiments, if the address matches the set-up that was performed over the network and the RESET line is de-asserted, the START line assertion can cause the core logic 210 to start the operation. The control device 302 can retrieve the data from the memory device 308 and transfer the data through the ISP programming bus 322 and the ISP connector 326. At the end of the data transfer, a verification step can cause a programming status to be returned through the ISP connector 326 and the ISP status bus 324. The control device 302, upon receiving the status from the ISP status bus 324, can communicate that status to the PCB tester 108 by activating the PASS line 312 or the FAIL line 314.

In some embodiments, the control device 302 can reflect the status of the ICT input bus 310, the PASS line 312, the FAIL line 314, and a network activity indicator by activating corresponding lines on the LED bus 318 and illuminating the corresponding set of the light emitting diodes 320. This status can be enabled or disabled in the set-up phase. The PCB tester 108 can initialize the core logic 210 by asserting the RESET line in the ICT input bus 310.

Figure 4:
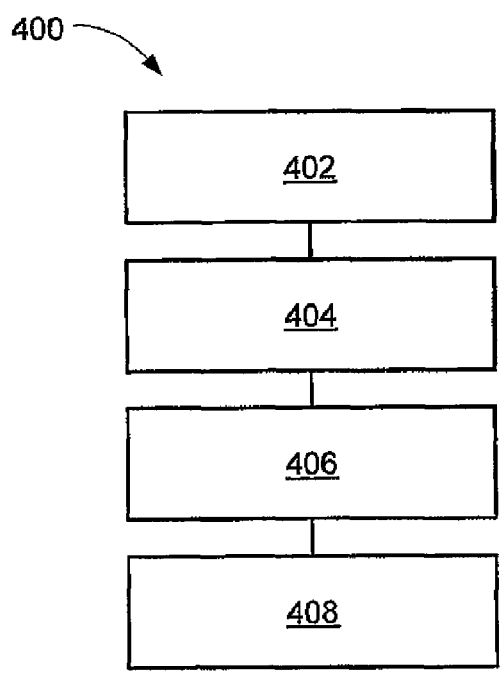
FIG. 4 is a flow chart of a system for a manufacturing test and programming system in accordance with one or more embodiments.

FIG. 4 is a flow chart of a system 400 for a manufacturing test and programming system in accordance with one or more embodiments. The system 400 can include providing a PCB tester in a block 402; providing an in-system programmer electrically attached to the PCB tester in a block 404; mounting a device under test having a programmable device attached thereon in a block 406; and programming the programmable device with the in-system programmer in a block 408.

In greater detail, an example method to provide a manufacturing test and programming system, according to one or more embodiments, can be performed as follows:

(1) Providing a PCB tester electrically connected to a tester station (FIG. 1);

(2) Electrically attaching an in-system programmer, mounted in the tester station, to the PCB tester (FIG. 1);

(3) Configuring the in-system programmer to communicate with a programmable device (FIG. 1);

(4) Mounting a device under test having the programmable device attached thereon (FIG. 1);

(5) Utilizing an ISP cable for the in-system programmer to program the programmable device (FIG. 1).

CONCLUSION

It has been discovered that, according to some embodiments, a printed circuit board manufacturing process can be dramatically shortened by utilizing the in-system programmer to program programmable devices mounted on the printed circuit board. In some embodiments, this approach to PCB manufacturing can alleviate the need for an operator to pre-program the programmable devices and the requirement for the ICT to host the programming operation.

While the embodiments presented herein have been discussed with reference to certain example implementations, it is to be understood that many alternatives, modifications, and variations will be apparent to those skilled in the art in light of the foregoing description and without departing from the spirit and scope of the claimed embodiments.

What is claimed is:

1. A computer-implemented method, comprising:
   causing characterization data to be loaded onto a programmable device, wherein the characterization data is configured to cause the programmable device to perform one or more functions if executed on the programmable device;
   determining whether loading the characterization data onto the programmable device caused the programmable device to be successfully programmed; and
   causing an indication to be transmitted for receipt by an external device, the indication indicating whether or not the programmable device is successfully programmed.

2. The computer-implemented method of claim 1, wherein if the programmable device is successfully programmed, the indication causes a pass line to be asserted.

3. The computer-implemented method of claim 2, wherein the pass line is configured to be asserted through one or more optical isolators.

4. The computer-implemented method of claim 1, wherein if the programmable device is not successfully programmed, the indication causes a fail line to be asserted.

5. The computer-implemented method of claim 4, wherein the fail line is configured to be asserted through one or more optical isolators.

6. The computer-implemented method of claim 1, wherein if the programmable device is not successfully programmed, the indication indicates that the programmable device may be removed from an apparatus on which the programmable device is detachably mounted, the method further comprising causing the characterization data to be loaded onto a different programmable device.

7. The computer-implemented method of claim 1, wherein causing the characterization data to be loaded onto the programmable device is performed in response to a start signal initiated by the external device.

8. The computer-implemented method of claim 1, further comprising:
   causing the characterization data to be loaded on multiple programmable devices as part of a testing array; and determining whether loading the characterization data onto each of the multiple programmable devices caused each of the multiple programmable devices to be successfully programmed.

9. The computer-implemented method of claim 1, further comprising:
   causing a reset line to be asserted; and
   responsive to the reset line being asserted, causing the characterization data to be loaded onto a different programmable device.

10. A computer-implemented method, comprising:
    determining, responsive to characterization data being loaded onto a programmable device, whether the programmable device was successfully programmed;
    if the programmable device was successfully programmed, asserting a first line through one or more optical isolators to indicate to an external device that the programmable device was successfully programmed; or
    if the programmable device was not successfully programmed, asserting a second line through one or more optical isolators to indicate to the external device that the programmable device was not successfully programmed.

11. The computer-implemented method of claim 10, wherein programmable device is part of a device under test, and wherein the characterization data is configured to, if executed by the programmable device, cause the device under test to perform one or more functions.

12. The computer-implemented method of claim 10, further comprising:
    causing an indication that the programmable device can be removed from a programming device; and
    causing the programming device to load the characterization data onto a different programmable device.

13. A programming device, comprising:
    a tester interface configured to cause characterization data to be loaded onto a programmable device as part of a programming operation, the characterization data being configured to cause the programmable device to perform one or more functions if executed by the programmable device;
    a first line configured to be asserted by the programming device if the programmable device was successfully programmed with the characterization data as part of the programming operation; and
    a second line configured to be asserted by the programming device if the programmable device was not successfully programmed with the characterization data as part of the programming operation.

14. The programming device of claim 13, wherein the first line or the second line, if asserted, causes an indication of whether or not the programmable device was successfully programmed to be transmitted for receipt by an external device.

15. The programming device of claim 14, wherein the first line comprises a pass line that is configured to be asserted through one or more optical isolators.

16. The programming device of claim 14, wherein the second line comprises a fail line that is configured to be asserted through one or more optical isolators.

17. The programming device of claim 13, wherein the programmable device is part of a device to be tested, and wherein the programming device is configured to enable the device to be tested to be detachably mounted on the programming device.

18. The programming device of claim 17, wherein the programming device is configured to enable multiple different devices to be tested to be detachably mounted on the programming device and cause the characterization data to be loaded on each of the multiple different devices to be tested.

19. The programming device of claim 13, wherein the programming device is configured to autonomously load the characterization data onto the programmable device and determine if the programmable device was successfully programmed.

20. The programming device of claim 13, further comprising a reset line that, if asserted, causes the programmer interface to cause the characterization data to be loaded onto a different programmable device.

* * * * *